(12) United States Patent
Zhang et al.

(10) Patent No.: US 11,764,259 B2
(45) Date of Patent: Sep. 19, 2023

(54) VERTICAL FIELD-EFFECT TRANSISTOR WITH DIELECTRIC FIN EXTENSION

(71) Applicant: International Business Machines Corporation, Armonk, NY (US)

(72) Inventors: Chen Zhang, Guilderland, NY (US); Tenko Yamashita, Schenectady, NY (US); Xin Miao, San Jose, CA (US); Wenyu Xu, Albany, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 17/384,307

(22) Filed: Jul. 23, 2021

(65) Prior Publication Data
US 2023/0023157 A1    Jan. 26, 2023

(51) Int. Cl.
*H01L 29/06* (2006.01)
*H01L 29/417* (2006.01)
*H01L 29/66* (2006.01)
*H01L 29/49* (2006.01)
*H01L 29/78* (2006.01)

(52) U.S. Cl.
CPC .... *H01L 29/0649* (2013.01); *H01L 29/41741* (2013.01); *H01L 29/4966* (2013.01); *H01L 29/4983* (2013.01); *H01L 29/66666* (2013.01); *H01L 29/7827* (2013.01)

(58) Field of Classification Search
CPC .......... H01L 29/0649; H01L 29/41741; H01L 29/4966; H01L 29/4983; H01L 29/66666; H01L 29/7827

USPC ........................................................ 257/329
See application file for complete search history.

(56) References Cited

U.S. PATENT DOCUMENTS

| | | | |
|---|---|---|---|
| 6,770,534 B2 | 8/2004 | Cho et al. | |
| 7,683,428 B2 | 3/2010 | Chidambarrao et al. | |
| 9,614,087 B1 | 4/2017 | Cheng et al. | |
| 9,755,073 B1 | 9/2017 | Cheng et al. | |
| 9,793,401 B1 | 10/2017 | Balakrishnan et al. | |
| 9,806,173 B2 | 10/2017 | Balakrishnan et al. | |
| 9,882,047 B2 | 1/2018 | Leobandung | |
| 10,043,891 B1 | 8/2018 | Bao et al. | |
| 10,084,094 B1 | 9/2018 | Cheng et al. | |
| 10,453,940 B1 | 10/2019 | Mochizuki et al. | |
| 10,886,269 B2* | 1/2021 | Ching | H01L 21/823481 |
| 10,943,830 B2* | 3/2021 | Chiang | H01L 29/66545 |
| 2006/0261406 A1 | 11/2006 | Chen | |
| 2016/0336421 A1* | 11/2016 | Cheng | H01L 27/1211 |
| 2019/0006486 A1* | 1/2019 | Ching | H01L 21/823821 |
| 2019/0051733 A1* | 2/2019 | Zang | H01L 29/66545 |
| 2020/0043935 A1* | 2/2020 | Liaw | H01L 27/0207 |
| 2020/0328127 A1* | 10/2020 | Yamashita | H01L 21/3086 |
| 2021/0166977 A1* | 6/2021 | Wu | H01L 21/76805 |

* cited by examiner

*Primary Examiner* — Mohammad M Hoque
(74) *Attorney, Agent, or Firm* — Samuel Waldbaum; Ryan, Mason & Lewis, LLP

(57) ABSTRACT

A vertical field-effect transistor includes a substrate comprising a semiconductor material; a first set of fins formed from the semiconductor material and extending vertically with respect to the substrate; and a second set of fins extending vertically with respect to the substrate, wherein ones of the second set of fins abut ones of the first set of fins. The second set of fins comprises a dielectric material.

20 Claims, 12 Drawing Sheets

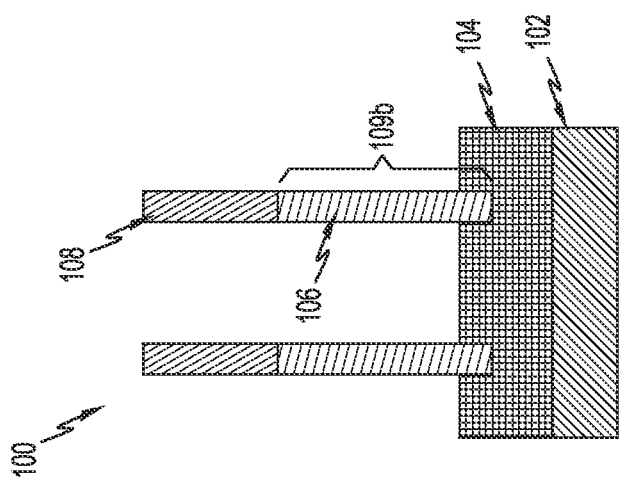
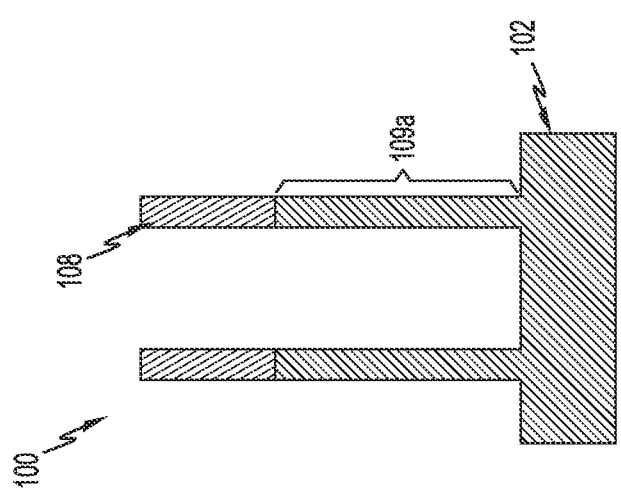

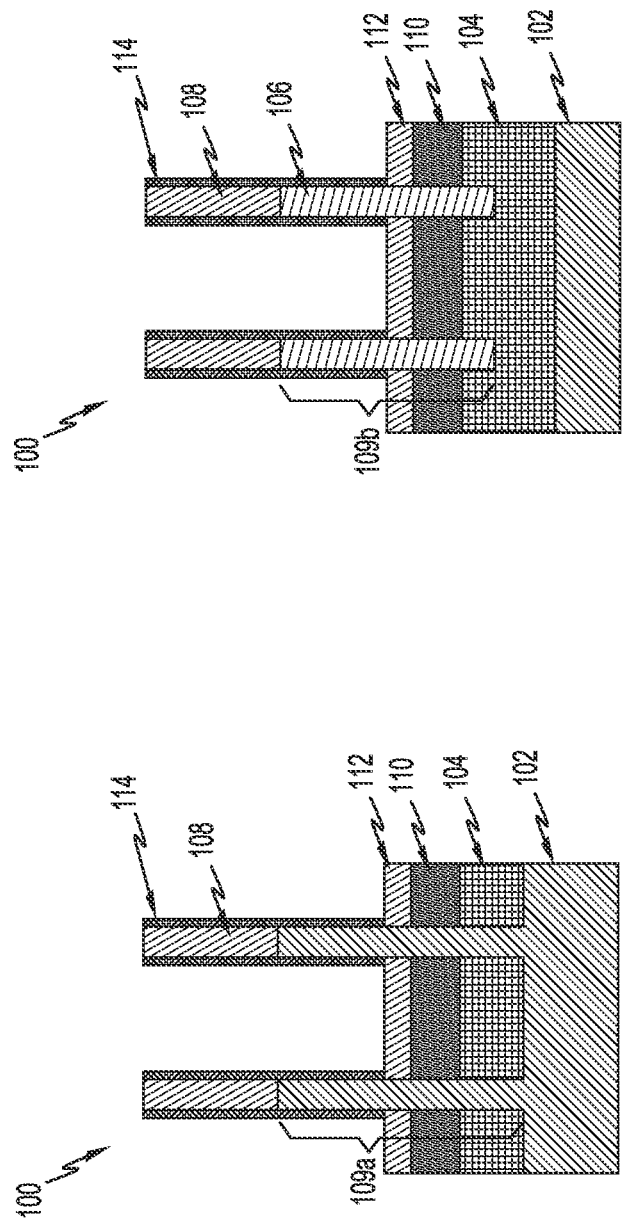

AA

BB

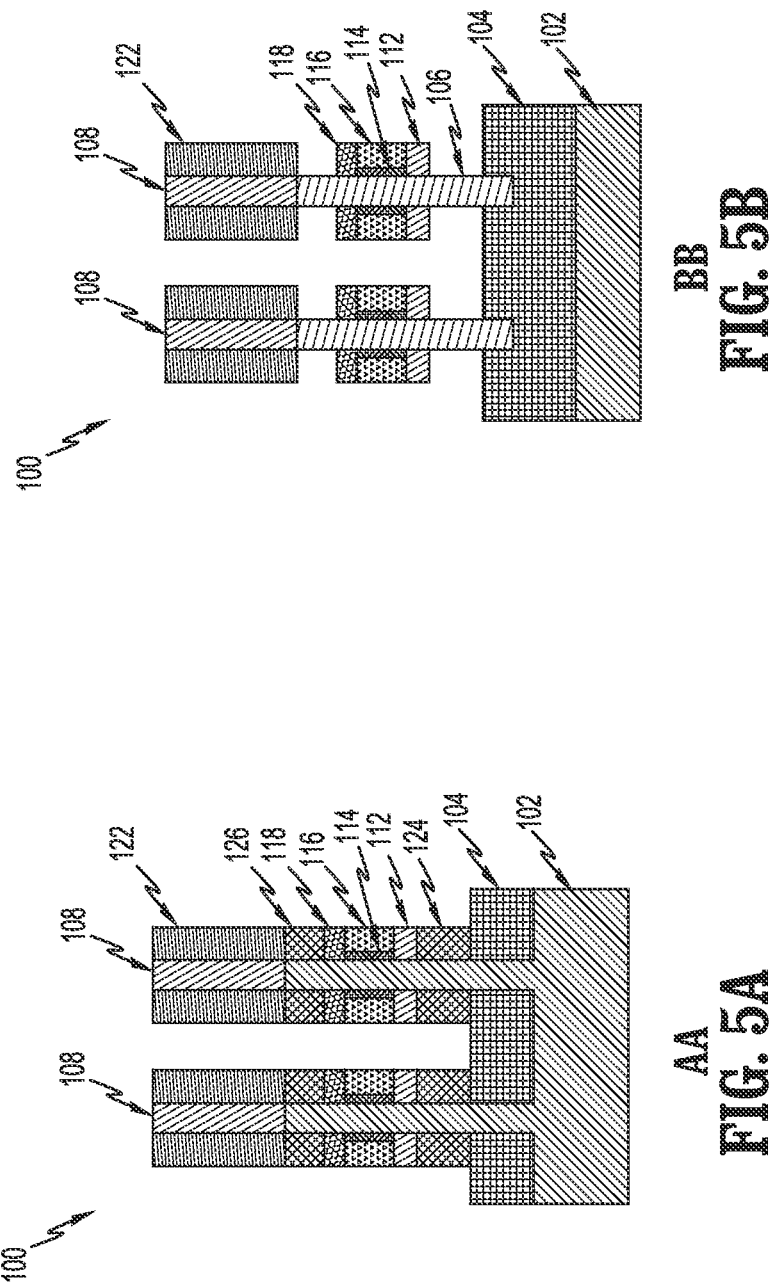

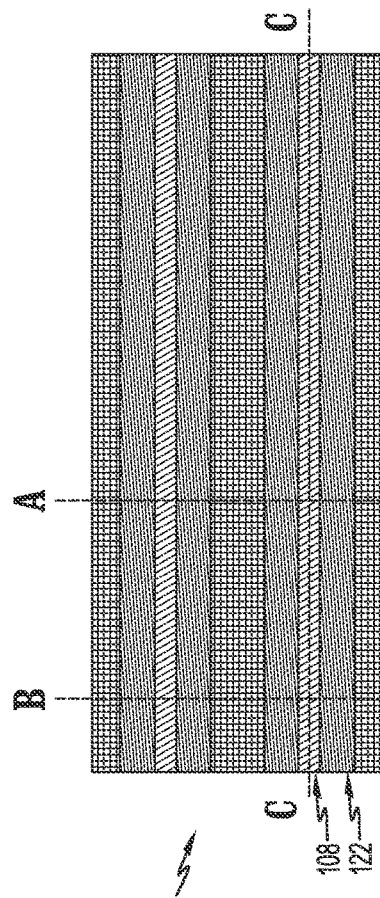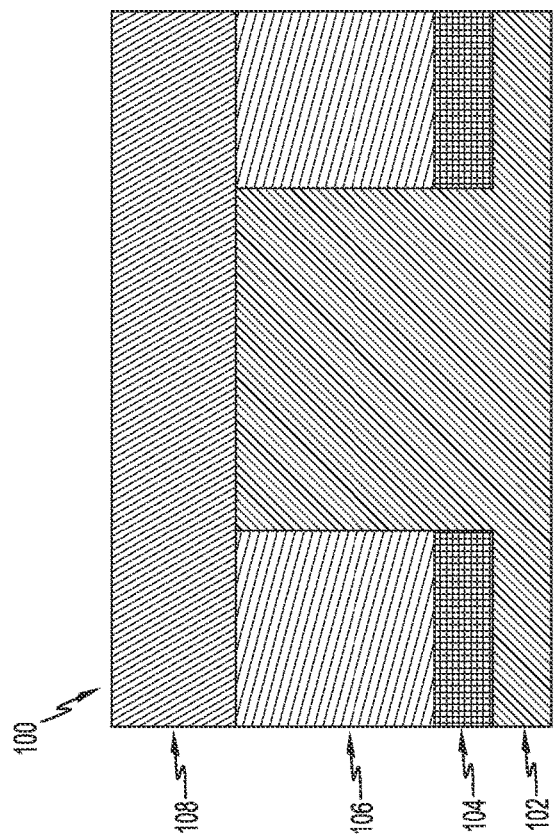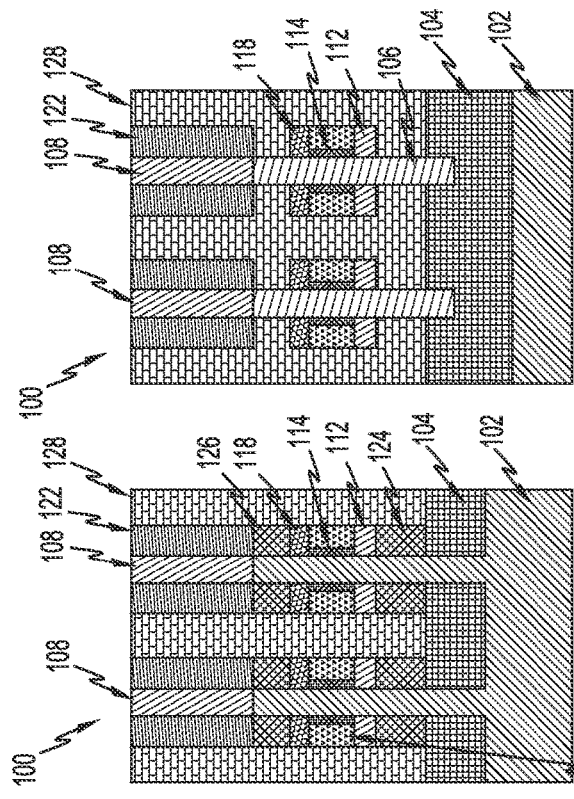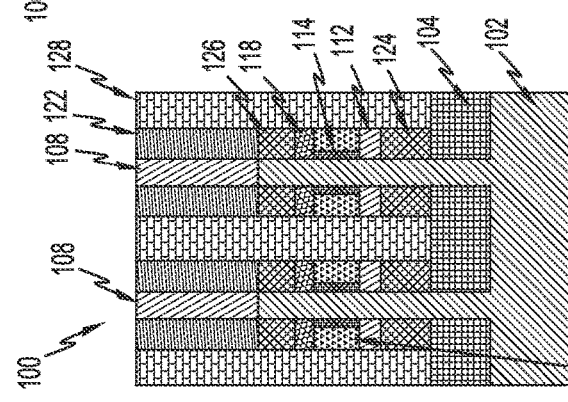

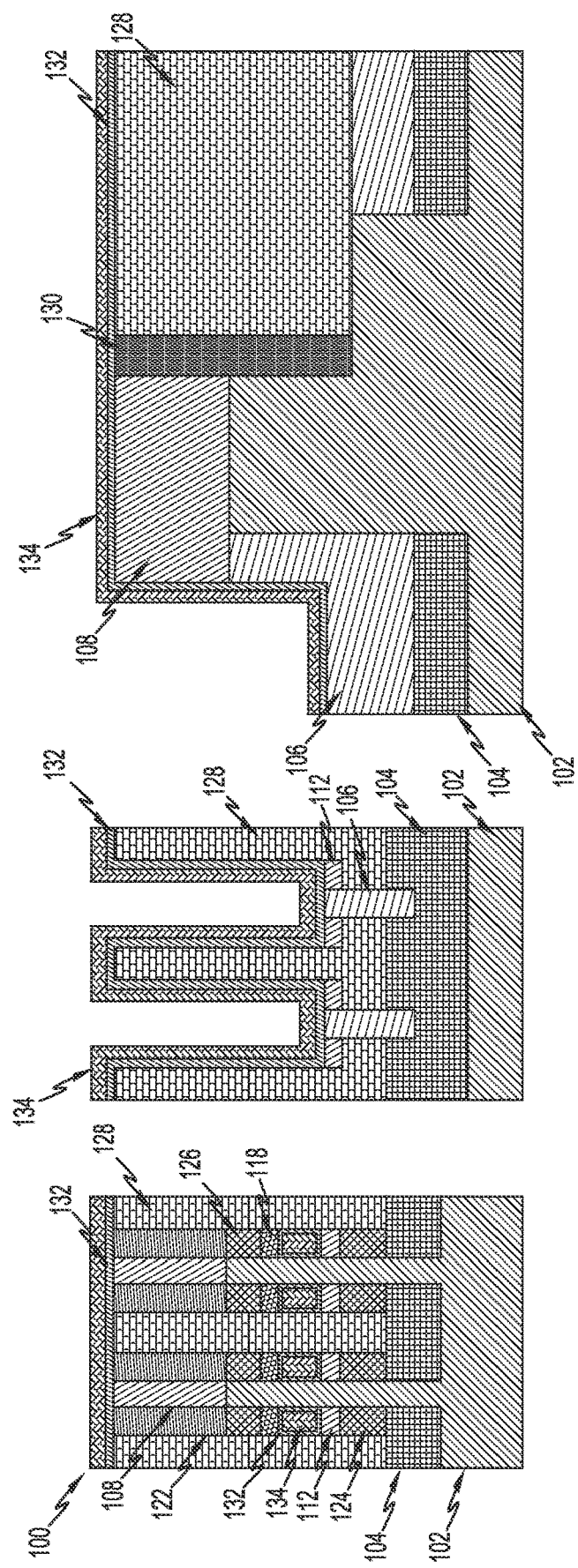

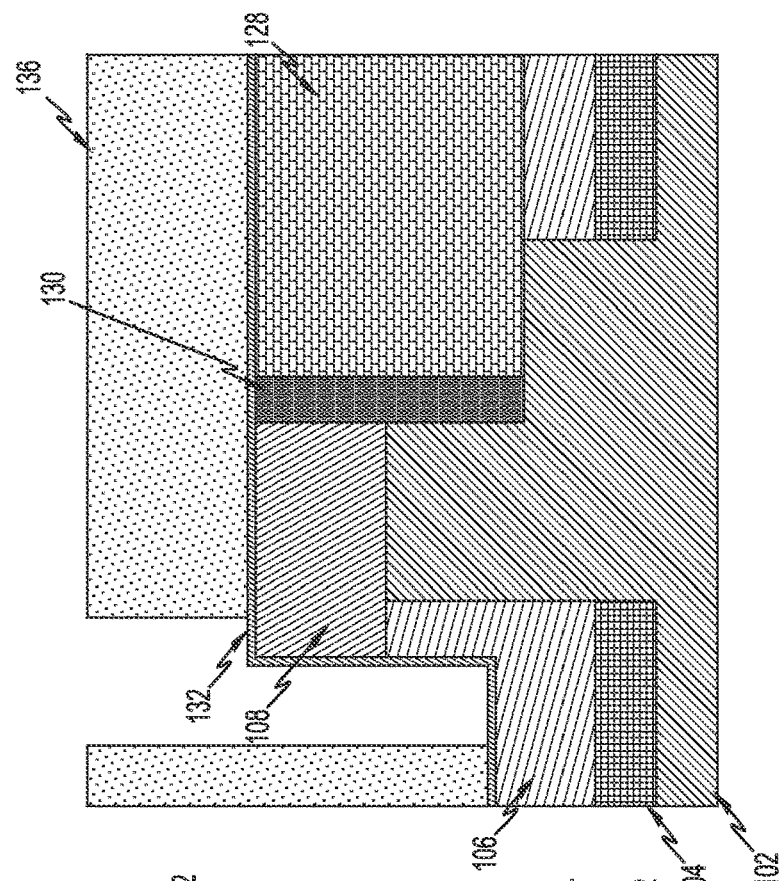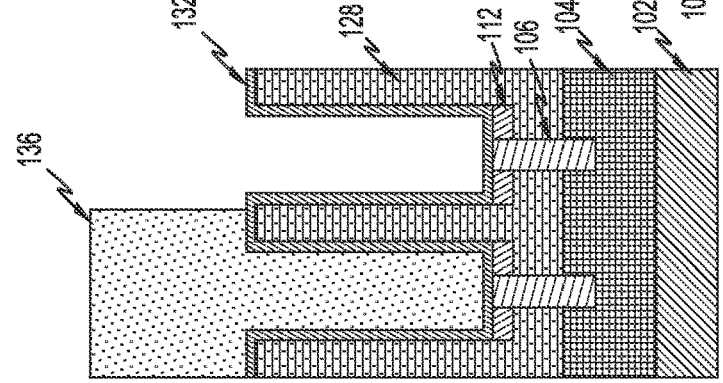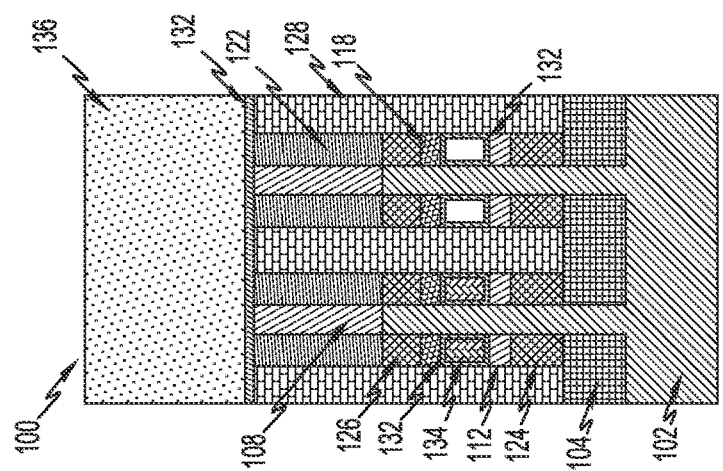

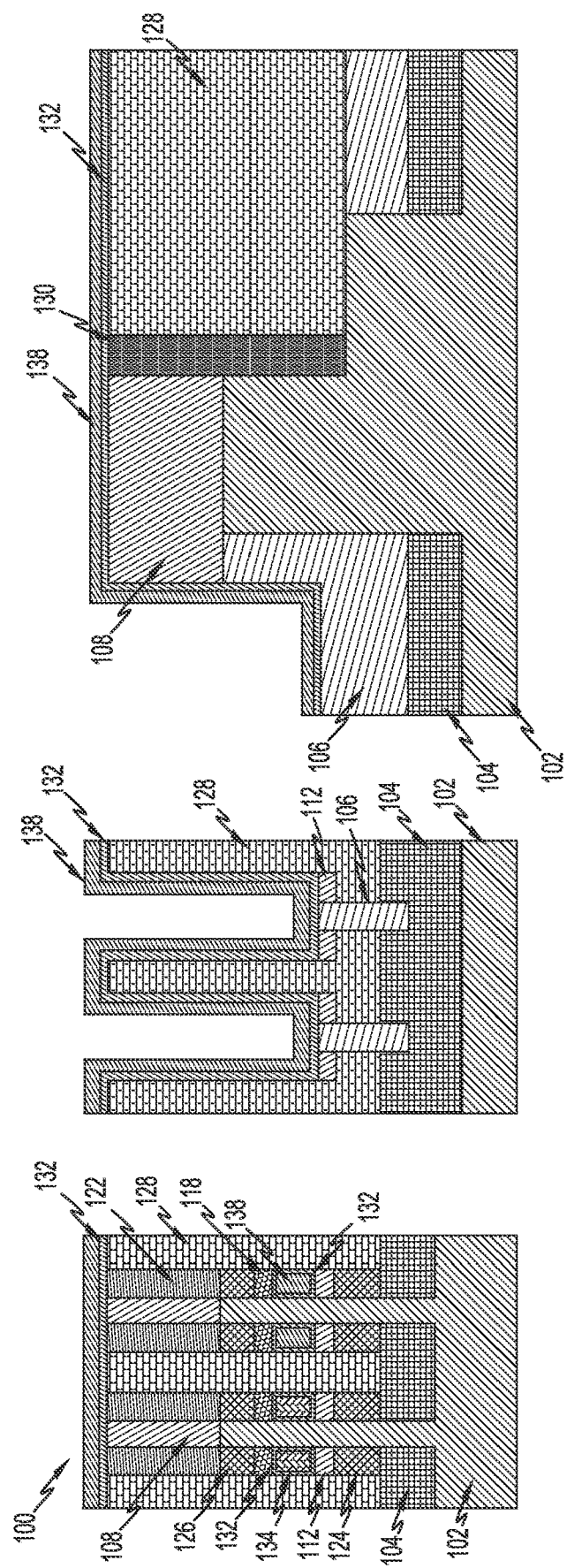

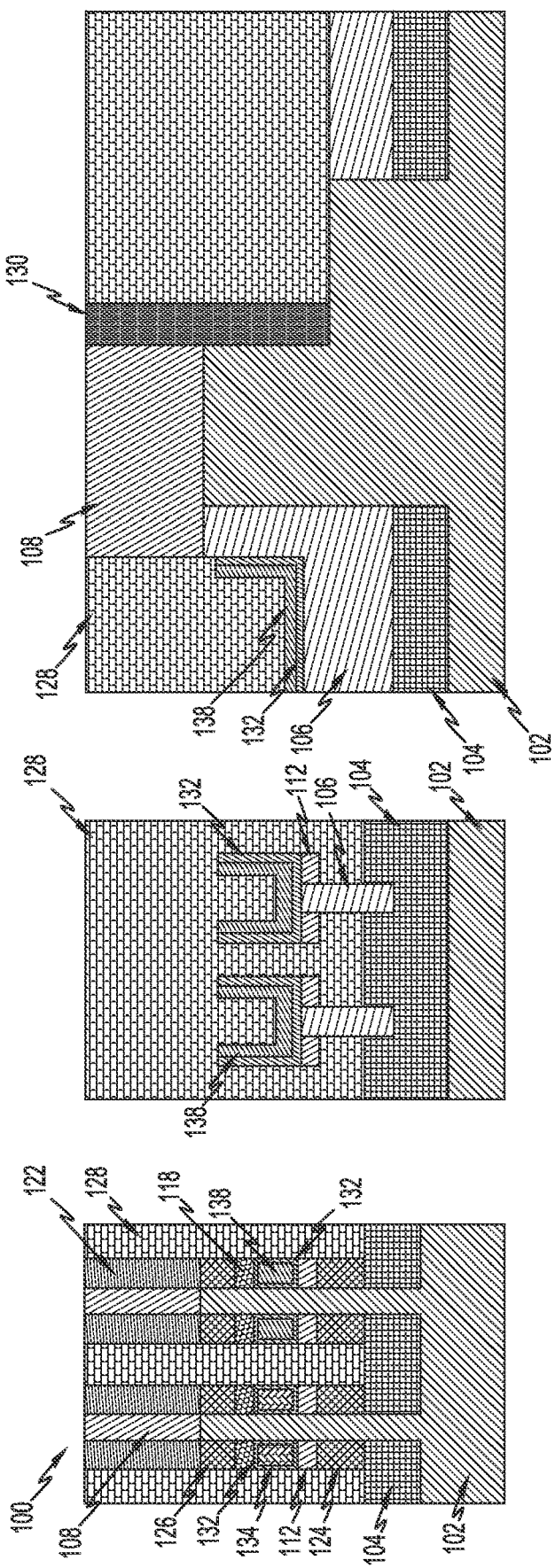

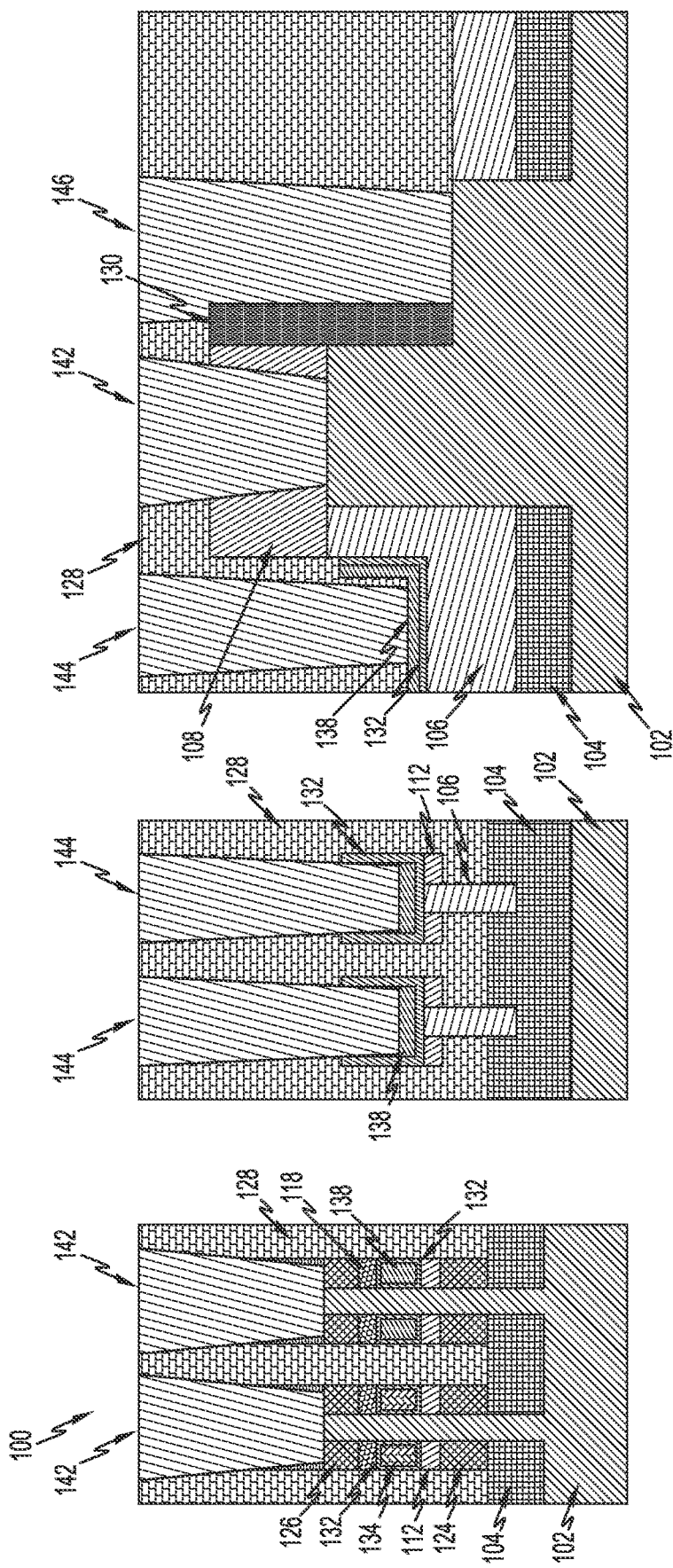

VERTICAL FIELD-EFFECT TRANSISTOR WITH DIELECTRIC FIN EXTENSION

BACKGROUND

This disclosure relates generally to semiconductor fabrication techniques and, in particular, to structures and methods for fabricating vertical field-effect transistor devices.

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field-effect transistors (VFETs) (also referred to as vertical transport field-effect transistors (VTFETs)) have become viable device options for scaling semiconductor devices (e.g., complementary metal oxide semiconductor (CMOS) devices) to 5 nanometer (nm) node and beyond. VFET devices include fin channels with source/drain regions at ends of the fin channels on top and bottom sides of the fins. Current flows through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

SUMMARY

According to an exemplary embodiment, a vertical field-effect transistor device comprises a substrate which comprises a semiconductor material. The vertical field-effect transistor device further comprises a first set of fins formed from the semiconductor material and extending vertically with respect to the substrate. The vertical field-effect transistor device further comprises a second set of fins extending vertically with respect to the substrate, wherein ones of the second set of fins abut ones of the first set of fins. The second set of fins comprises a dielectric material.

According to an exemplary embodiment, an integrated circuit comprises a plurality of semiconductor devices, wherein at least one of the plurality of semiconductor devices comprises a vertical field-effect transistor device. The vertical field-effect transistor device comprises a substrate which comprises a semiconductor material. The vertical field-effect transistor device further comprises a first set of fins formed from the semiconductor material and extending vertically with respect to the substrate. The vertical field-effect transistor device further comprises a second set of fins extending vertically with respect to the substrate, wherein ones of the second set of fins abut ones of the first set of fins. The second set of fins comprises a dielectric material.

According to an exemplary embodiment, a method for manufacturing a vertical field-effect transistor device comprises patterning a substrate comprising a semiconductor material. The method further comprising forming a first set of fins comprising the semiconductor material and extending vertically with respect to the substrate. The method further comprises forming a second set of fins on the substrate, wherein ones of the second set of fins abut ones of the first set of fins. The second set of fins comprises a dielectric material.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 2A is a cross-sectional view illustrating the semiconductor structure taken along the A-A axis of FIG. 1A at a second-intermediate fabrication stage, according to an illustrative embodiment.

FIG. 2B is a cross-sectional view of the semiconductor structure taken along the B-B axis of FIG. 1A at the second-intermediate fabrication stage, according to an illustrative embodiment.

FIG. 3A is a cross-sectional view illustrating the semiconductor structure taken along the A-A axis of FIG. 1A at a third-intermediate fabrication stage, according to an illustrative embodiment.

FIG. 3B is a cross-sectional view of the semiconductor structure taken along the B-B axis of FIG. 1A at the third-intermediate fabrication stage, according to an illustrative embodiment.

FIG. 5A is a cross-sectional view illustrating the semiconductor structure taken along the A-A axis of FIG. 1A at a fifth-intermediate fabrication stage, according to an illustrative embodiment.

FIG. 5B is a cross-sectional view of the semiconductor structure taken along the B-B axis of FIG. 1A at the fifth-intermediate fabrication stage, according to an illustrative embodiment.

FIG. 6A is a top view illustrating a semiconductor structure for use at a sixth-intermediate fabrication stage, according to an illustrative embodiment.

FIG. 6B is a cross-sectional view illustrating the semiconductor structure taken along the A-A axis of FIG. 6A at the sixth-intermediate fabrication stage, according to an illustrative embodiment.

FIG. 6C is a cross-sectional view of the semiconductor structure taken along the B-B axis of FIG. 6A at the sixth-intermediate fabrication stage, according to an illustrative embodiment.

FIG. 6D is a cross-sectional view of the semiconductor structure taken along the C-C axis of FIG. 6A at the sixth-intermediate fabrication stage, according to an illustrative embodiment.

FIG. 8A is a cross-sectional view illustrating the semiconductor structure taken along the A-A axis of FIG. 7A at an eighth-intermediate fabrication stage, according to an illustrative embodiment.

FIG. 8B is a cross-sectional view of the semiconductor structure taken along the B-B axis of FIG. 7A at the eighth-intermediate fabrication stage, according to an illustrative embodiment.

FIG. 8C is a cross-sectional view of the semiconductor structure taken along the C-C axis of FIG. 7A at the eighth-intermediate fabrication stage, according to an illustrative embodiment.

FIG. 9A is a cross-sectional view illustrating the semiconductor structure taken along the A-A axis of FIG. 7A at a ninth-intermediate fabrication stage, according to an illustrative embodiment.

FIG. 9B is a cross-sectional view of the semiconductor structure taken along the B-B axis of FIG. 7A at the ninth-intermediate fabrication stage, according to an illustrative embodiment.

FIG. 9C is a cross-sectional view of the semiconductor structure taken along the C-C axis of FIG. 7A at the ninth-intermediate fabrication stage, according to an illustrative embodiment.

FIG. 10A is a cross-sectional view illustrating the semiconductor structure taken along the A-A axis of FIG. 7A at a tenth-intermediate fabrication stage, according to an illustrative embodiment.

FIG. 10B is a cross-sectional view of the semiconductor structure taken along the B-B axis of FIG. 7A at the tenth-intermediate fabrication stage, according to an illustrative embodiment.

FIG. 10C is a cross-sectional view of the semiconductor structure taken along the C-C axis of FIG. 7A at the tenth-intermediate fabrication stage, according to an illustrative embodiment.

FIG. 11A is a cross-sectional view illustrating the semiconductor structure taken along the A-A axis of FIG. 7A at an eleventh-intermediate fabrication stage, according to an illustrative embodiment.

FIG. 11B is a cross-sectional view of the semiconductor structure taken along the B-B axis of FIG. 7A at the eleventh-intermediate fabrication stage, according to an illustrative embodiment.

FIG. 11C is a cross-sectional view of the semiconductor structure taken along the C-C axis of FIG. 7A at the eleventh-intermediate fabrication stage, according to an illustrative embodiment.

FIG. 12A is a cross-sectional view illustrating the semiconductor structure taken along the A-A axis of FIG. 7A at a twelfth-intermediate fabrication stage, according to an illustrative embodiment.

FIG. 12B is a cross-sectional view of the semiconductor structure taken along the B-B axis of FIG. 7A at the twelfth-intermediate fabrication stage, according to an illustrative embodiment.

FIG. 12C is a cross-sectional view of the semiconductor structure taken along the C-C axis of FIG. 7A at the twelfth-intermediate fabrication stage, according to an illustrative embodiment.

DETAILED DESCRIPTION

Figure 1A:
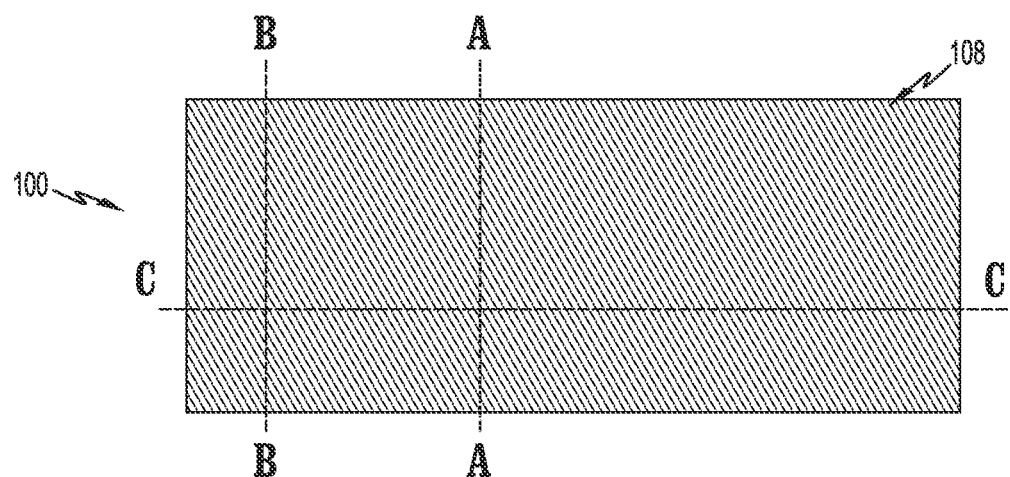
FIG. 1A is a top view illustrating a semiconductor structure for use at a first-intermediate fabrication stage, according to an illustrative embodiment.

This disclosure relates generally to transistors, and more particularly to vertical fin-shaped field effect transistors and methods for their fabrication. Exemplary embodiments will now be discussed in further detail with regard to semiconductor devices and methods of manufacturing same and, in particular, to VFET devices including a dummy fin extension.

VFETs are a promising option for technology scaling for 5 nm and beyond. However, process challenges for VFETs include gate length and spacer thickness control, N and P type work function metal/multi-voltage devices, self-aligned gate and junction abruptness. Accordingly, illustrative embodiments described herein correspond to VFETs with a replacement metal gate (RMG) scheme which employ dummy fins to handle the challenges of RMG flow. For example, with dummy fins, an equal pitch structure can be created to reduce etch loading effect. In addition, a dummy fin (also referred to herein as a "fin extension" since a dummy fin can be considered an extension of a semiconductor fin) assists in forming a pocket structure associated with each individual semiconductor fin so that a gate is naturally isolated and self-aligned to the semiconductor fin. Also, as the work function metal does not pinch off the pocket in the area between an NFET and a PFET of the VFET, an N-type work function metal and P-type work function metal patterning can be done easily with conventional lithography and wet etch processes. Finally, the junction abruptness can be improved by doing quasi-embedded epitaxial growth.

It is to be understood that the various layers and/or regions shown in the accompanying drawings are not drawn to scale, and that one or more layers and/or regions of a type commonly used in, for example, field-effect transistor (FET), FinFET, VFET, CMOS, nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein implies that a small margin of error may be present, such as 1% or less than the stated amount.

The semiconductor devices and methods for forming same in accordance with embodiments described herein can be employed in applications, hardware, and/or electronic systems. Suitable hardware and systems for implementing illustrative embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of illustrative embodiments provided herein, one of ordinary skill in the art will be able to contemplate other implementations and applications of embodiments described herein.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1A-12C illustrate various processes for fabricating VFETs with a dummy fin extension. Note that the same reference numeral (100) is used to denote the semiconductor structure through the various intermediate fabrication stages illustrated in FIGS. 1A through 12C. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-12C are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1B:
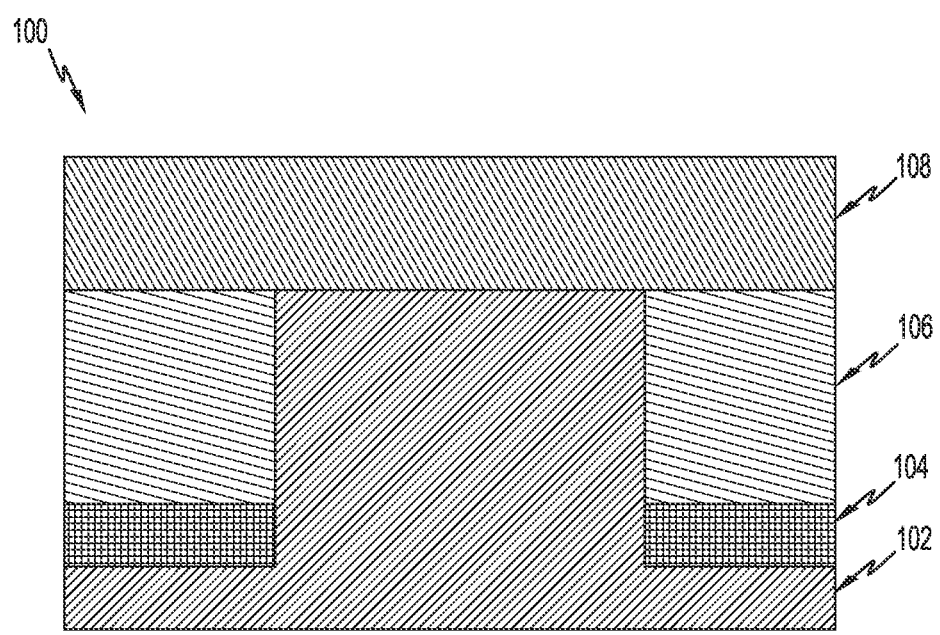
FIG. 1B is a cross-sectional view of the semiconductor structure taken along the C-C axis of FIG. 1A at a first-intermediate fabrication stage, according to an illustrative embodiment.

FIG. 1A is a top view illustrating a semiconductor structure for use at a first-intermediate fabrication stage. FIG. 1B is a cross-sectional view of the semiconductor structure taken along the C-C axis of FIG. 1A at the first-intermediate fabrication stage. FIGS. 1A and 1B show a semiconductor structure 100 having a semiconductor substrate 102, shallow trench isolation layer 104, dielectric layer 106, and a hardmask 108. Semiconductor substrate 102 can be a semiconductor material including, for example, silicon (Si), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g., Groups III-V), or other like semiconductor materials. In addition, multiple layers of the semiconductor materials can be used as the semiconductor material of the substrate. Semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide. If desired, an additional semiconductor material may be deposited on the substrate different than the semiconductor substrate material, e.g., by epitaxial growth on the original substrate, such as a SiGe film grown on a Si substrate, and then patterned as discussed below in forming fins 109a. Thus, the semiconductor material, e.g., a SiGe film, will remain on the fins 109a.

Shallow trench isolation layer 104 may be formed by any technique known in the art. For example, a hardmask layer (not shown) may be deposited on the surface of semiconductor substrate 102 to preferably act as an etch stop layer that can be used, as needed, throughout the vertical fin fabrication process. Next, a photoresist layer (not shown) may be provided above the hardmask. A shallow trench isolation recess is formed by a dry etching process known in the art. The recess may also be formed by a wet etching step comprising hydrogen fluoride, HF. A shallow trench isolation layer 104 is then deposited into the shallow trench and the semiconductor structure is then polished by chemical mechanical polishing (CMP).

The shallow trench isolation layer 104 comprises a dielectric material such as silicon oxide or silicon oxynitride, and is formed by methods known in the art. For example, in one illustrative embodiment, shallow trench isolation layer 104 is a shallow trench isolation oxide layer. In one embodiment, the shallow trench isolation is formed by high density plasma chemical vapor deposition (HDP CVD) to deposit silicon dioxide in the shallow trenches. The deposition of non-silicon containing isolating materials into the shallow trenches is envisioned.

After depositing the shallow trench isolation layer 104, dielectric layer 106 is deposited on shallow trench isolation layer 104. The dielectric layer 106 can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering. Suitable material for dielectric layer 106 includes, for example, a nitride-based material such as SiN, SiCN, and SiON. After depositing dielectric layer 106, the hardmask (not shown) is removed and the dielectric layer 106 is recessed to be coplanar with substrate 102 by such techniques as reactive ion etching (RIE).

Hardmask 108 is then deposited on the exposed top surfaces of substrate 102 and dielectric layer 106 by conventional techniques, e.g., CVD. Suitable material for hardmask 108 includes, for example, $Si_3N_4$, SiBCN, SiNC, SiN, SiCO, $SiO_2$, and SiNOC. Hardmask 108 can then be planarized by, for example, CMP.

FIGS. 2A and 2B show forming vertical fins 109a and 109b having sidewalls that are substantially vertical for semiconductor structure 100. Although two vertical fins for each set of fins 109a and 109b are shown, the number of fins should not be considered limiting. Thus, a "set of fins" as used herein can be considered as including one or more fins. To form the vertical fins, lithography and etching are performed using any type of patterning technique such as a direct-print lithography or a sidewall-image-transfer (SIT) process. A direct-print lithography process maybe one of 193i lithography or extreme ultra-violet (EUV) lithography, familiar to those skilled in the art. A SIT process may be referred to as a self-aligned double patterning (SADP) process. For example, vertical fins 109a and 109b can be formed through a process involving masking, using industry-standard lithographic techniques, and directionally etching (e.g., RIE) the substrate 102 underneath the hardmask 108 for vertical fins 109a and dielectric layer 106 underneath the hardmask 108 for vertical fins 109b. Thus, the resulting fins will be substrate fins 109a (see FIG. 2A) and dielectric fins 109b (also referred to as "dummy fins") (see FIG. 2B). In one embodiment, dummy fins 109b have an equal pitch structure to reduce a loading effect in the downstream fabrication process. In one embodiment, at least one fin of dummy fins 109b will abut at least one of substrate fins 109a (see FIG. 12C). In another embodiment, a portion of at least one fin of dummy fins 109b will be in contact with a portion of at least one of substrate fins 109a (see FIG. 12C). After forming the fins, the patterned photoresist is removed utilizing resist stripping processes, for example, ashing. Ashing can be performed using a suitable reaction gas, for example, $O_2$, $N_2$, $H_2/N_2$, $O_3$, $CF_4$, or any combination thereof.

FIG. 3A and FIG. 3B show forming dummy bottom source/drain region 110 on shallow trench isolation layer 104 and around substrate fins 109a (FIG. 3A) and dummy fins 109b (FIG. 3B). Conventional deposition processes and etching are employed in forming the dummy bottom source/drain region 110. Suitable dummy material to form dummy bottom source/drain region 110 includes, for example, an amorphous material such as amorphous SiGe (a-SiGe). In one or more embodiments, amorphous SiGe refers to SiGe that does not have a crystalline structure.

A bottom spacer layer 112 is then deposited on dummy bottom source/drain region 110 and around substrate fins 109a (FIG. 3A) and dummy fins 109b (FIG. 3B). The bottom spacer layer 112 can be deposited using deposition techniques including, but not limited to, CVD, PECVD, RFCVD, PVD, ALD, and/or sputtering. Suitable material for bottom spacer layer 112 includes, for example, SiN, SiCN, and SiCO.

Next, a liner layer 114 is deposited on the remaining portion of the exterior surfaces of substrate fins 109a (FIG. 3A) and dummy fins 109b (FIG. 3B). The liner layer 114 can be any suitable oxide material such as, for example, silicon oxide. Liner layer 114 may be formed using any suitable deposition techniques including CVD, ALD, PVD, PECVD, chemical solution deposition or other like processes followed by CMP.

Figure 4A:
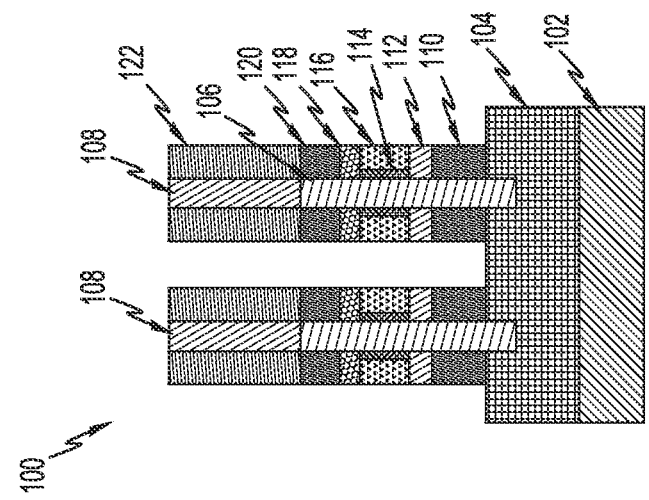
FIG. 4A is a cross-sectional view illustrating the semiconductor structure taken along the A-A axis of FIG. 1A at a fourth-intermediate fabrication stage, according to an illustrative embodiment.
Figure 4B:
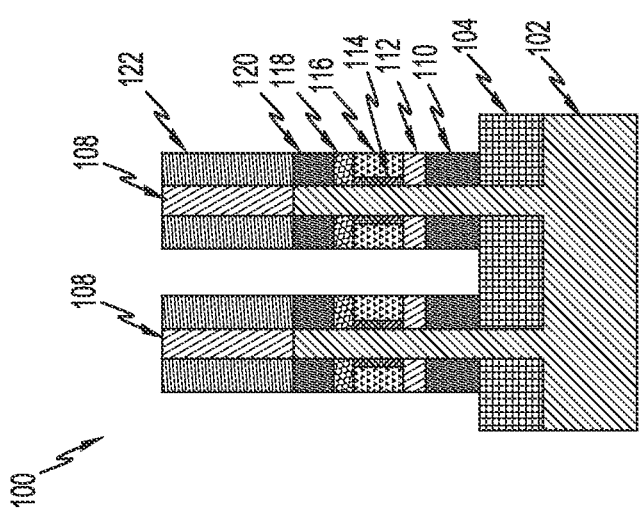
FIG. 4B is a cross-sectional view of the semiconductor structure taken along the B-B axis of FIG. 1A at the fourth-intermediate fabrication stage, according to an illustrative embodiment.

FIGS. 4A and 4B show first forming dummy gate 116 on bottom spacer layer 112, on a portion of liner layer 114 and around substrate fins 109a (FIG. 4A) and dummy fins 109b (FIG. 4B). Conventional deposition processes and etching are employed in forming the dummy gate 116. Suitable dummy gate material to form dummy gate 116 includes, for example, an amorphous material such as amorphous Si (a-Si). Following deposition of dummy gate 116, the exposed portion of liner layer 114 remaining on fins 109a and 109b is removed by conventional techniques, e.g., RIE.

Next, top spacer layer 118 is deposited on dummy gate 116 and around substrate fins 109a and dummy fins 109b. The top spacer layer 118 can be deposited using deposition techniques including, but not limited to, CVD, PECVD, RFCVD, PVD, ALD, and/or sputtering. Suitable material for top spacer layer 118 includes, for example, SiN, SiCN, and SiCO.

Dummy top source/drain region 120 is formed on top spacer layer 118 and around substrate fins 109a and dummy fins 109b exposing hardmask 108. Conventional deposition processes and etching are employed in forming the dummy top source/drain region 120. Suitable dummy material to form dummy top source/drain region 120 includes, for example, an amorphous material such as a-SiGe.

Sidewall spacers 122 are then deposited on the exterior sidewall surfaces of hardmask 108 and coplanar with the top surface of hardmask 108. The sidewall spacers 122 may be formed, for example, by forming a conformal layer of sidewall dielectric and removing horizontal portions with a directional etch, e.g., RIE. In an embodiment, the sidewall spacers 122 can be a nitride, for example, a silicon nitride (SiN), or an oxynitride, for example, silicon oxynitride (SiON). In some exemplary embodiments, sidewall spacers 122 can include a material that is resistant to some etching processes such as, for example, HF chemical etching or chemical oxide removal etching.

Next, semiconductor structure 100 is subjected to a directional etch to remove a portion of the dummy bottom source/drain region 110, bottom spacer layer 112, dummy gate 116, top spacer layer 118 and dummy top source/drain region 120 between adjacent sidewall spacers 122 and exposing the top surface of shallow trench isolation layer 104.

FIGS. 5A and 5B show removing dummy bottom source/drain region 110 and dummy top source/drain region 120 by performing a directional etch. A directional etch may include, but is not limited to, RIE. As shown in FIG. 5B, removal of dummy bottom source/drain region 110 and dummy top source/drain region 120 leaves exposed portions of dielectric layer 106 of dummy fin 109b.

Next, FIG. 5A further shows bottom source/drain region 124 and top source/drain region 126 being formed by, for example, first forming a source drain epi layer (NFET S/D epi or PFET S/D epi) on a portion of shallow trench isolation layer 104 and around the exposed sidewalls of substrate fin 109a for bottom source/drain region 124, and on top spacer layer 118 and around the exposed sidewalls of substrate fin 109a for top source/drain region 126. Optionally, the exposed parts of the substrate fin 109a may be subjected to certain etching processes before S/D growth. Such an etching should be selective only to fin 109a but not affecting fin 109b. As a result, the exposed fin becomes thinner in width or can be fully removed. The structure can still remain as fin 109b serves as the anchor. Next, an etching process is applied to directionally recess the epitaxy layer grown and align bottom source/drain region 124 and top source/drain region 126 with bottom spacer layer 112, dummy gate 116 and top spacer layer 118. The epitaxially grown bottom source/drain region 124 and top source/drain region 126 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. Accordingly, one of fin 109a can be a PFET and the other can be an NFET, or both can be an NFET or PFET.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

FIGS. 6A-6D show forming an interlevel dielectric (ILD) layer 128 on the top surface of shallow trench isolation layer 104 and up to a top surface of sidewall spacer 122. The ILD layer 128 includes, for example, any suitable flowable dielectric material such as a flowable chemical vapor deposition (FCVD) oxide.

Figure 7A:
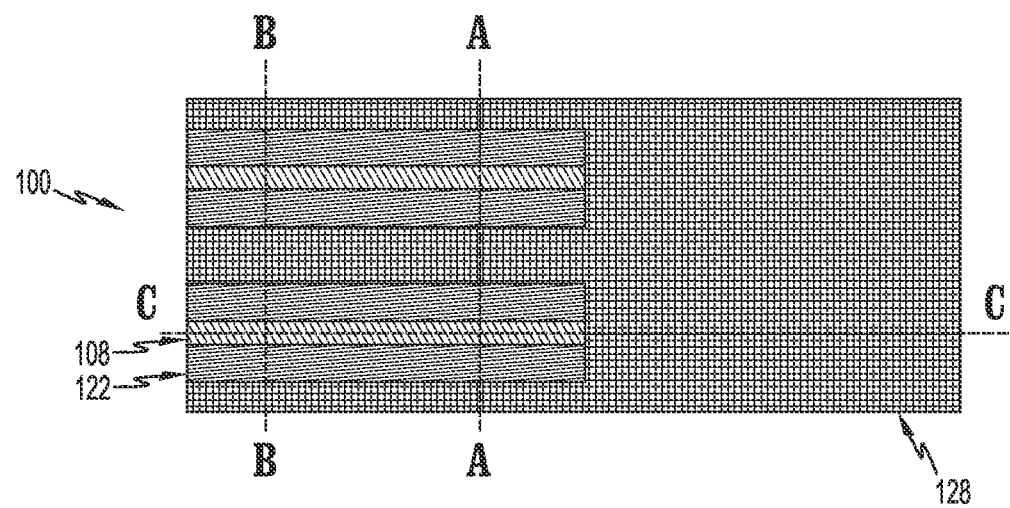
FIG. 7A is a top view illustrating a semiconductor structure for use at a seventh-intermediate fabrication stage, according to an illustrative embodiment.
Figure 7B:
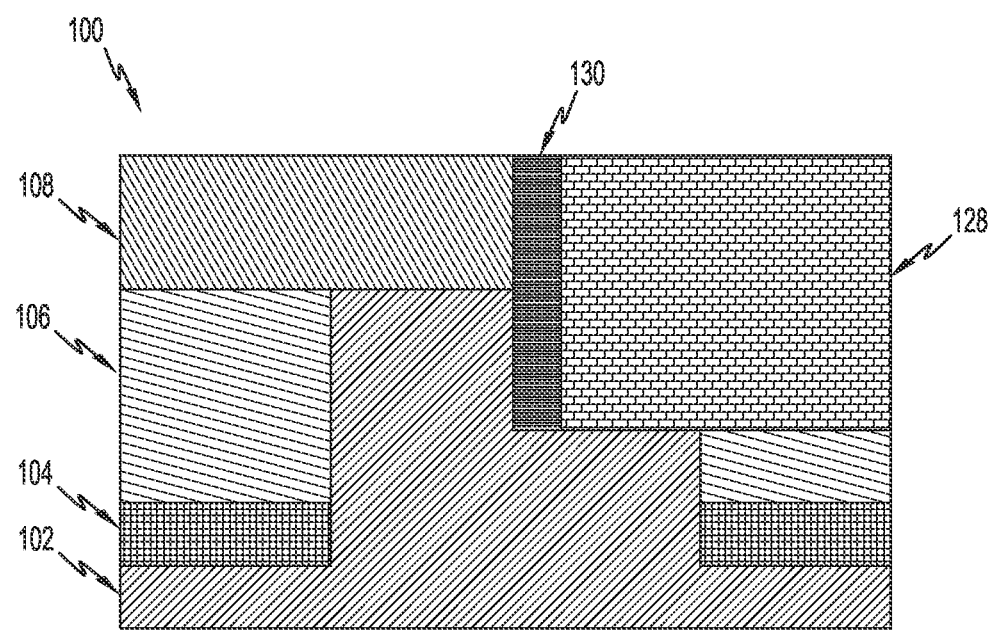
FIG. 7B is a cross-sectional view illustrating the semiconductor structure taken along the C-C axis of FIG. 7A at the seventh-intermediate fabrication stage, according to an illustrative embodiment.

FIGS. 7A and 7B show forming an additional ILD layer 128 on substrate 102 and dielectric layer 106. During this stage, a portion of hardmask 108, dielectric layer 106 and substrate 102 (see FIG. 6D) are removed by RIE. Next, ILD layer 128 is deposited by, for example, FCVD as discussed above. If desired, optional liner layer 130 can be deposited before forming ILD layer 128 by conventional techniques.

FIGS. 8A-8C show forming a work function metal. During this stage, a trench is formed by first removing ILD layer 128, sidewall spacer 122, top spacer layer 118, dummy gate 116, liner layer 114 and hardmask 108 to expose bottom spacer layer 112 and dielectric fin 109b using a suitable well know photolithographic mask and etch technique (see FIG. 8B). For example, a mask can be deposited on the top surface of ILD layer 128 between adjacent sidewall spacers 122 and then directionally etching the trench by, for example, ME. In addition, dummy gate 116 and liner layer 114 are removed from substrate fins 109a (see FIG. 8A). The dummy gate 116 and liner layer 114 may be removed using any suitable wet etch, such as ammonia followed by a HF based solution, or a highly selective dry etch.

Next, a replacement metal gate is formed on semiconductor structure 100. First, a high-k gate dielectric layer 132 is deposited on semiconductor structure 100 employing, for example, CVD. Suitable high-k dielectric material includes, for example, hafnium oxide ($HfO_2$), HfSiO, HfSiON, AlO, $Al_2O_3$, Titanium oxide ($TiO_2$), Lanthanum oxide ($La_2O_3$) or a combination or stack thereof. A work function metal 134 is then formed on a portion of dielectric layer 132 employing, for example, CVD, sputtering, or plating. The work function metal 134 includes one or more metals having a function suitable to tune the work function of NFETs or PFETs. For example, suitable work function metals include titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and work function metal. The gate conductor and work function metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

FIGS. 9A-9C show selectively recessing work function metal 134 from semiconductor structure 100 and leaving the work function metal 134 around one of substrate fins 109a (see FIG. 9A). Work function metal 134 is selectively removed by, for example, an isotropic etching process. During this stage, organic planarization layer (OPL) 136 is selectively deposited using, e.g., a spin-on coating process. The OPL 136 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 136 can include a transparent organic polymer. The OPL can be a standard CxHy polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

FIGS. 10A-10C show forming a second work function metal 138 on dielectric layer 132 employing, for example, CVD, sputtering, or plating. The work function metal layer 138 includes one or more metals having a function suitable to tune the work function of NFETs or PFETs as discussed for work function metal 134. Work function metal 138 can be different than work function metal 134.

FIGS. 11A-11C show chamfering dielectric layer 132 and work function metal 138. The dielectric layer 132 and work function metal 138 are chamfered in the trench over dielectric layer 106 (i.e., dummy fins) to form a gate contact as discussed below. Next, ILD layer 128 is further deposited over dielectric layer 132 and work function metal 134 and filling the trench. The deposition techniques and material for ILD layer 128 are discussed above.

FIGS. 12A-12C show forming metal contacts 142, 144 and 146 by patterning and etching a via/trench (not shown) and depositing a conductive metal. For example, metal contact 142 is an electrical contact that provides electrical connectivity to top source/drain region 126. Metal contact 144 is an electrical contact that provides electrical connectivity to work function metal 138 and is an electrical connection to a gate. Metal contact 146 is an electrical contact that provides electrical connectivity to bottom source/drain 124.

The metal contacts are formed by first forming conductive vias or trenches by methods known in the art, e.g., selectively etching through the ILD layer 128 by, for example, RIE, such that the via is communicative with the respective component, e.g., conductive vias or trenches for metal contacts 142, 144 and 146 communicative with the respective region. A conductive material is then deposited within the via. The conductive material for metal contacts 142, 144 and 146 can be of the same or different material. The conductive material can include any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Advantageously, as explained herein, illustrative embodiments fabricate a set of one or more dielectric fin extensions (e.g., dummy fins) and a dummy gate (e.g., a-Si material), wherein the dummy gate becomes self-aligned with a semiconductor fin along the semiconductor fin height orientation. As such, a VTFET device is provided containing a dielectric fin extension on either or both sides of the semiconductor fin, with gate stacking wraps on the sidewalls of the semiconductor fin and the dielectric fin extension.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A vertical field-effect transistor device comprising:
   a shallow trench isolation layer disposed on a substrate comprising a semiconductor material;
   a first set of fins formed from the semiconductor material and extending vertically with respect to the substrate;
   a second set of fins extending vertically with respect to the substrate, wherein ones of the second set of fins abut a lateral sidewall of ones of the first set of fins, wherein the second set of fins comprises a dielectric material, and wherein a portion of the ones of the second set of fins are disposed within the shallow trench isolation layer;
   a first interlevel dielectric layer disposed on the substrate and over the second set of fins, the first interlevel dielectric layer comprising a first gate structure disposed therein and in contact with at least a top surface of each fin of the second set of fins; and
   a gate metal contact disposed in the first interlevel dielectric layer and in contact with a top surface of the first gate structure;
   wherein at least one fin of the first set of fins comprises:
   a first source/drain region disposed on at least a portion of the substrate and around the at least one fin of the first set of fins;
   a second gate structure disposed above the first source/drain region; and
   a second source/drain region disposed above the second gate structure; and
   wherein the first set of fins are each of a first height, and the second set of fins are each of a second height, the second height being less than the first height.

2. The vertical field-effect transistor device according to claim 1, wherein at least one other fin of the first set of fins comprises:
   a third source/drain region disposed on at least a portion of the substrate and around the at least one other fin of the first set of fins;
   a third gate structure disposed above the third source/drain region; and
   a fourth source/drain region disposed above the third gate structure.

3. The vertical field-effect transistor device according to claim 2, wherein the second gate structure of the at least one fin of the first set of fins comprises a first dielectric layer and a first work function metal, and the third gate structure of the at least one other fin of the first set of fins comprises a second dielectric layer and a second work function metal.

4. The vertical field-effect transistor device according to claim 2, further comprising:
   a first spacer layer disposed between the first source/drain region and the second gate structure of the at least one fin of the first set of fins, and between the third source/drain region and the third-gate structure of the at least one other fin of the first set of fins; and
   a second spacer layer disposed between the second gate structure and the second source/drain region of the at least one fin of the first set of fins, and between the third gate structure and the fourth source/drain region of the at least one other fin of the first set of fins.

5. The vertical field-effect transistor device according to claim 2, further comprising:
   a second interlevel dielectric layer disposed on the substrate and over the first set of fins, the second interlevel dielectric layer comprising a source/drain metal contact disposed therein and in contact with a top surface of the second source/drain region and the respective fin of the first set of fins.

6. The vertical field-effect transistor device according to claim 1, wherein a portion of one fin of the second set of fins is in contact with a portion of one fin of the first set of fins.

7. The vertical field-effect transistor device according to claim 1, further comprising an epitaxial semiconductor material disposed on each fin of the first set of fins.

8. An integrated circuit, comprising:
   a plurality of semiconductor devices, wherein at least one of the plurality of semiconductor devices comprises a vertical field-effect transistor device comprising:
   a shallow trench isolation layer disposed on a substrate comprising a semiconductor material;
   a first set of fins formed from the semiconductor material and extending vertically with respect to the substrate;
   a second set of fins extending vertically with respect to the substrate, wherein ones of the second set of fins abut a lateral sidewall of ones of the first set of fins, wherein the second set of fins comprises a dielectric material, and wherein a portion of the ones of the second set of fins are disposed within the shallow trench isolation layer;

a first interlevel dielectric layer disposed on the substrate and over the second set of fins, the first interlevel dielectric layer comprising a first gate structure disposed therein and in contact with at least a top surface of each fin of the second set of fins; and a gate metal contact disposed in the first interlevel dielectric layer and in contact with a top surface of the first gate structure;

wherein at least one fin of the first set of fins comprises:

a first source/drain region disposed on at least a portion of the substrate and around the at least one fin of the first set of fins;

a second gate structure disposed above the first source/drain region; and a second source/drain region disposed above the second gate structure; and wherein the first set of fins are each of a first height, and the second set of fins are each of a second height, the second height being less than the first height.

9. The integrated circuit according to claim 2, wherein at least one other fin of the first set of fins comprises:

a third source/drain region disposed on at least a portion of the substrate and around the at least one other fin of the first set of fins;

a third gate structure disposed above the third source/drain region; and a fourth source/drain region disposed above the third gate structure.

10. The integrated circuit according to claim 9, wherein the second gate structure of the at least one fin of the first set of fins comprises a first dielectric layer and a first work function metal, and the third gate structure of the at least one other fin of the first set of fins comprises a second dielectric layer and a second work function metal.

11. The integrated circuit according to claim 9, further comprising:

a first spacer layer disposed between the first source/drain region and the second gate structure of the at least one fin of the first set of fins, and between the third source/drain region and the third-gate structure of the at least one other fin of the first set of fins; and a second spacer layer disposed between the second gate structure and the second source/drain region of the at least one fin of the first set of fins, and between the third gate structure and the fourth source/drain region of the at least one other fin of the first set of fins.

12. The integrated circuit according to claim 8, further comprising:

a second interlevel dielectric layer disposed on the substrate and over the first set of fins, the second interlevel dielectric layer comprising a source/drain metal contact disposed therein and in contact with a top surface of the second source/drain region and the respective fin of the first set of fins.

13. A vertical field-effect transistor device, comprising:

a shallow trench isolation layer disposed on a substrate comprising a semiconductor material;

a first set of fins formed from the semiconductor material and extending vertically with respect to the substrate; and a second set of dummy fins extending vertically with respect to the substrate, wherein ones of the second set of dummy fins abut a lateral sidewall of ones of the first set of fins, and wherein a portion of the ones of the second set of fins are disposed within the shallow trench isolation layer;

a first dielectric layer on a top surface of a given dummy fin;

a first work function metal disposed on the first dielectric layer;

a first metal contact disposed on the first work function metal; and a second metal contact disposed on a given fin of the first set of fins;

wherein at least one fin of the first set of fins comprises:

a first source/drain region disposed on at least a portion of the substrate and around the at least one fin of the first set of fins;

a first gate structure disposed above the first source/drain region; and a second source/drain region disposed above the first gate structure; and wherein the first set of fins are each of a first height, and the second set of dummy fins are each of a second height, the second height being less than the first height.

14. The vertical field-effect transistor device according to claim 13, wherein each of the second set of dummy fins comprises a dielectric material.

15. The vertical field-effect transistor device according to claim 13, wherein at least one other fin of the first set of fins comprises:

a third source/drain region disposed on at least a portion of the substrate and around the at least one other fin of the first set of fins;

a second gate structure disposed above the third source/drain region; and a fourth source/drain region disposed above the second gate structure.

16. The vertical field-effect transistor device according to claim 15, wherein the first gate structure of the at least one fin of the first set of fins comprises a second dielectric layer and a second work function metal, and the second gate structure of the at least one other fin of the first set of fins comprises a third dielectric layer and a third work function metal.

17. The vertical field-effect transistor device according to claim 15, further comprising:

a first spacer layer disposed between the first source/drain region and the first gate structure of the at least one fin of the first set of fins, and between the third source/drain region and the second gate structure of the at least one other fin of the first set of fins; and a second spacer layer disposed between the first gate structure and the second source/drain region of the at least one fin of the first set of fins, and between the second gate structure and the fourth source/drain region of the at least one other fin of the first set of fins.

18. The vertical field-effect transistor device according to claim 15, further comprising:

a first interlevel dielectric layer disposed on the substrate and over the first set of fins, the first interlevel dielectric layer comprising a source/drain metal contact disposed therein and in contact with a top surface of the second source/drain region and the respective fin of the first set of fins.

19. The vertical field-effect transistor device according to claim 13, wherein a portion of one fin of the second set of dummy fins is in contact with a portion of one fin of the first set of fins.

20. The vertical field-effect transistor device according to claim 13, wherein each of the second set of dummy fins comprises a nitride-based material selected from the group consisting of SiN, SiCN, and SiON.

* * * * *